United States Patent [19]

Crawford

[11] Patent Number: 4,810,904
[45] Date of Patent: Mar. 7, 1989

[54] SAMPLE-AND-HOLD PHASE DETECTOR CIRCUIT

[75] Inventor: James A. Crawford, Fullerton, Calif.

[73] Assignee: Hughes Aircraft Company, Los Angeles, Calif.

[21] Appl. No.: 205,553

[22] Filed: Jun. 6, 1988

Related U.S. Application Data

[60] Continuation of Ser. No. 908,842, Sep. 18, 1986, abandoned, which is a division of Ser. No. 756,409, Jul. 17, 1985, Pat. No. 4,634,998.

[51] Int. Cl.⁴ .................. G11C 27/02; H03K 3/57
[52] U.S. Cl. .................................. 307/353; 307/257; 307/319
[58] Field of Search ............... 307/352, 353, 319, 321, 307/257

[56] References Cited

U.S. PATENT DOCUMENTS

| | | | |
|---|---|---|---|
| 3,459,969 | 8/1969 | Jasper | 307/319 |
| 3,596,191 | 7/1971 | Stuckert | 307/353 |
| 3,750,036 | 7/1973 | Burrows et al. | 307/352 |
| 4,001,713 | 1/1977 | Egan | 331/1 A |
| 4,115,745 | 9/1978 | Egan | 331/17 |
| 4,151,473 | 4/1979 | Coleman et al. | 307/353 |
| 4,290,028 | 9/1981 | LeGrand | 331/1 A |
| 4,330,758 | 5/1982 | Swisher et al. | 331/1 A |
| 4,382,234 | 5/1983 | Olbrechts | 331/17 X |
| 4,434,407 | 2/1984 | Healey, III et al. | 331/4 |
| 4,496,912 | 1/1985 | Wynn | 331/1 A |
| 4,605,901 | 8/1986 | Kobori et al. | 307/352 |

OTHER PUBLICATIONS

G. C. Gillette, Digiphase Synthesizer, Frequency Technology, Aug. 1969, pp. 25-29.
Fairchild ECL, 11C90/11C91, Making Programmable UHF Counters When None Are Available Or ... Pulse Swallowing Revisited, Fairchild ECL Catalog, pp. 9-56 through 9-58.
U. Rhode, Low-Noise Frequency Synthesizers Using Fractional N Phase-Locked Loops, r.f. design, Jan.-/Feb. 1981, pp. 20-34.
D. D. Danielson, S. E. Froseth, A Synthesized Signal Source With Function Generator Capabilities, Hewlett-Packard Journal, Jan. 1979, pp. 18-26.
J. Gorski-Popiel, Frequency Synthesis: Techniques And Applications, IEEE Press, 1975, pp. 72-91.

*Primary Examiner*—John Zazworsky
*Attorney, Agent, or Firm*—Thomas A. Runk; Anthony W. Karambelas

[57] ABSTRACT

A sample-and-hold phase detector (30, 80, 90, 100, 110) which includes sample-and-hold circuitry (FIG. 6) having variable efficiency. Specifically, the sample-and-hold circuitry provides a sampling pulse of variable width which is controlled to be wider during acquisition and narrower during steady-state operation. Also provided is protection circuitry to neutralize leakage of the input signal to the output of the circuit when a sample control signal is not present.

8 Claims, 4 Drawing Sheets

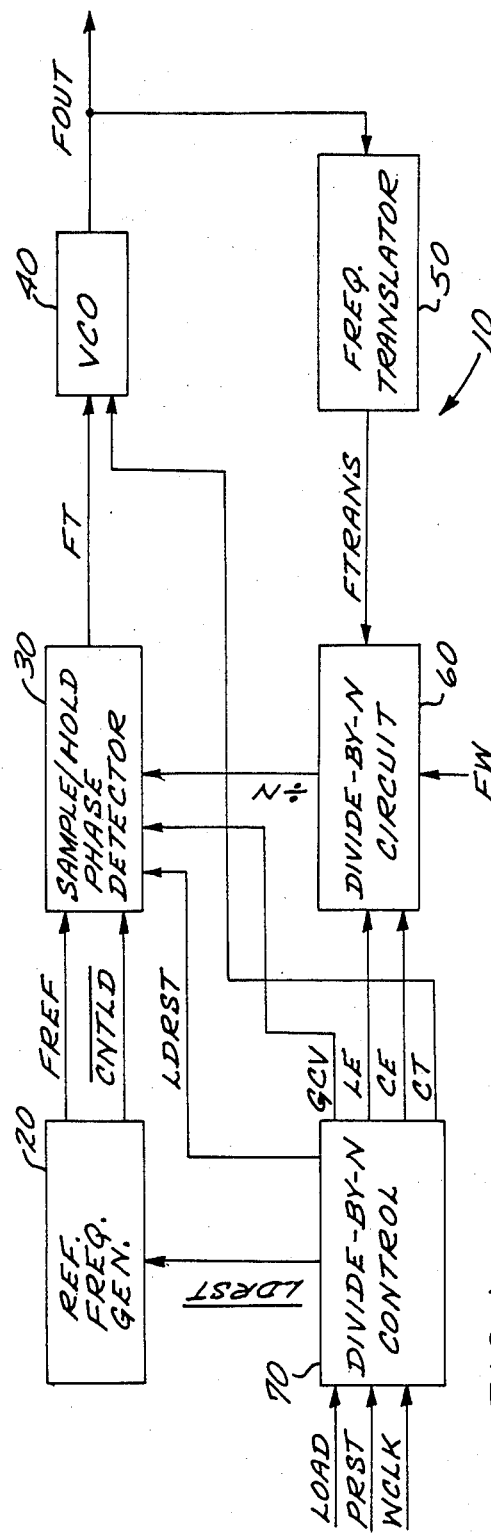
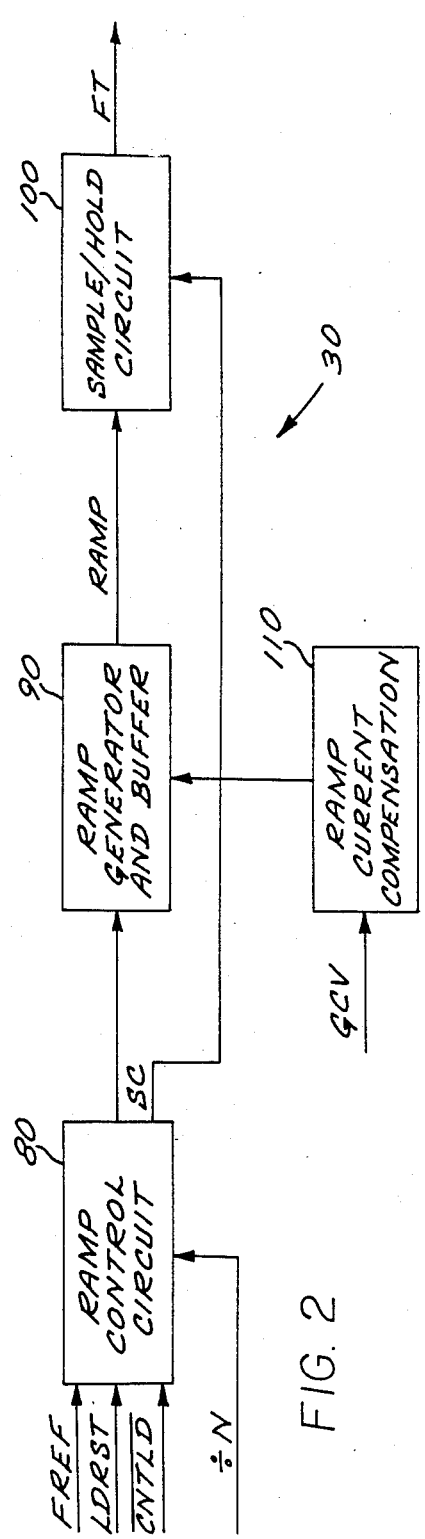
FIG. 1
FIG. 2

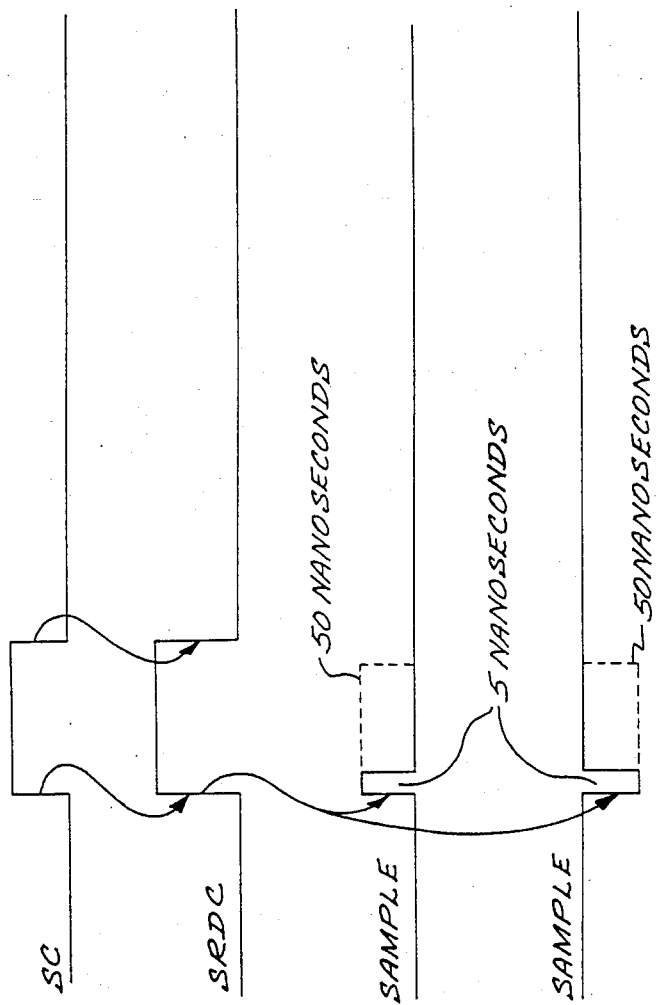

SAMPLE-AND-HOLD PHASE DETECTOR CIRCUIT

The United States government has rights to this invention pursuant to Contract No. F30602-82-C-0157 awarded by the Department of the Air Force.

This application is a continuation of application Ser. No. 908,842, filed Sept. 18, 1986, now abandoned, which is a division of application Ser. No. 756,409, filed July 17, 1985, now U.S. Pat. No. 4,634,998.

BACKGROUND OF THE INVENTION

The disclosed invention generally relates to frequency synthesizers and is more particularly directed to a phase-locked frequency synthesizer having a sample-and-hold phase detector with variable sampling efficiency for providing an adaptive loop bandwidth.

Frequency synthesizers are commonly employed to generate a frequency or frequencies based on a reference frequency. A commonly utilized technique is known as phase-locked or indirect frequency synthesis. Phase-locked frequency synthesizers are extensively described in the published art including for example "The Digiphase Synthesizer," by Garry C. Gillette, a paper presented in 1969 at the twenty-third Annual Frequency Control Symposium; "Low-Noise Frequency Synthesizers Using Fractional N Phase-Locked Loops," Ulrich Rhode, RF Design, January/February 1981, pp. 20–34; "A Synthesized Signal Source with Function Generator Capabilities," Dan D. Danielson and Stanley E. Froseth, Hewlett-Packard Journal, January, 1979, pp. 18–26; "Frequency Synthesis: Techniques and Applications," J. Gorski-Popiel, IEEE Press, 1975; and "Frequency Synthesis by Phase Lock," William F. Egan, John Wiley & Sons, 1981. Other examples of phase-locked frequency synthesizers include U.S. Pat. No. 4,290,028, issued to Jesse S. LeGrand on Sept. 15, 1981; U.S. Pat. No. 4,330,758, issued to Scott N. Swisher et al on May 18, 1982; and U.S. Pat. No. 4,437,407, issued to Daniel J. Healey, III et al on Feb. 28, 1984.

Phase-locked frequency synthesizers typically include a voltage controlled oscillator (VCO) which provides the output frequency. The VCO output frequency is coupled via a variable ratio frequency divider circuit to a phase detector. The reference frequency provides another input to the phase detector which provides an error signal for controlling the VCO. When the loop is locked, the two inputs to the phase detector have a constant phase relation and therefore the same frequency. The output of the VCO would then have a frequency equal to the reference frequency multiplied by the inverse of the divider circuit ratio.

Many types of phase detectors are utilized in phase-locked frequency synthesizers, including balanced mixers, high-speed samplers, exclusive-OR circuits, flip-flop circuits, and sample-and-hold circuits.

While phase-locked frequency synthesizers generally provide satisfactory performance, implementations are typically based on trade-offs between phase-lock acquisition performance and steady-state operation (phase-lock) performance. Simply stated, optimum phase-lock acquisition and optimum steady-state operation to some degree require different circuit characteristics. Particularly, an increased loop bandwidth provides for faster phase-lock acquisition, while a decreased loop bandwidth provides for steady-state operation with better spurious signal (sampling spurs) and phase noise performance. As a rseult, one condition may be optimized to the detriment of the other, depending on specific applications.

The problem of acquisition performance versus steady-state performance is significant in phase-locked frequency synthesizers which utilize sample-and-hold phase detectors. During acquisition, sample-and-hold phase detectors need to be fast, and the loop bandwidth must be increased to reduce phase-lock acquisition time. Phase-lock acquisition time may be particularly reduced by increased sampling efficiency. However, increased loop bandwidth and/or high high sampling efficiency results in increased phase noise and sampling spurs during steady-state operation.

An approach to optimizing both the acquisition performance and steady state performance in phase-locked frequency synthesizers involves utilizing a variable loop bandwidth. Thus, a particular loop bandwidth is utilized for acquisition while another loop bandwidth is utilized for steady-state operation. An example of a variable loop bandwidth system is disclosed in the previously cited patent to Swisher.

However, varying the loop bandwidth generally perturbs the steady-state condition. For example, the bandwidth change may occur over several sample periods, or the bandwidth change may also change the open loop again function. As a result, the phase-lock acquisition performance is degraded since acquisition time is effectively increased. Moreover, known variable loop bandwidth phase-locked frequency synthesizers tend to be complex and inefficient.

SUMMARY OF THE INVENTION

It would be in advantage to provide for a phase-locked frequency synthesizer a sample-and-hold circuit which allows for very fast acquisition and steady state operation with relatively low phase noise and low sampling spurs.

Another advantage would be to provide for a phase-locked frequency synthesizer a sample-and-hold circuit having variable efficiency.

Still another advantage would be to provide for a phase-locked frequency synthesizer a sample-and-hold circuit having variable efficiency and which does not perturb steady-state operation while changing efficiency.

The foregoing and other advantages and features are provided by the invention in a phase-locked frequency synthesizer which includes a voltage controlled oscillator (VCO) for providing an output signal having a selectable output frequency; divider circuitry responsive to the VCO output signal for dividing by a division ratio N and for providing divide-by-N signal pulses having a frequency related to the output frequency; ramp generating circuitry for starting a ramp signal in response to a reference frequency signal pulse and for stopping the ramp signal in response to a divide-by-N signal pulse; and sample-and-hold circuitry having variable efficiency for sampling the ramp signal in response to a divide-by-N signal pulse. The sample-and-hold circuitry specifically includes sample pulse generating circuitry for providing a sample pulse of selectively variable width. For phase-lock acquisition, the width of the sample pulse is controlled to be wider which provides for higher sampling efficiency and increased looped bandwidth. For steady-state operation, the sample pulse width is controlled to be narrower which provides for lower sampling efficiency and reduced loop bandwidth.

BRIEF DESCRIPTION OF THE DRAWINGS

The advantages and features of the disclosed inention will readily be appreciated by persons skilled in the art from the following detailed description when read in conjunction with the accompanying drawing wherein:

FIG. 1 is a block diagram of the disclosed frequency synthesizer.

FIG. 2 is a block diagram of the sample-and-hold phase detector of the frequency synthesizer of FIG. 1.

FIG. 5 is a timing diagram of certain signals in the sample-and-hold circuit of FIG. 6.

DETAILED DESCRIPTION

Figure 3:
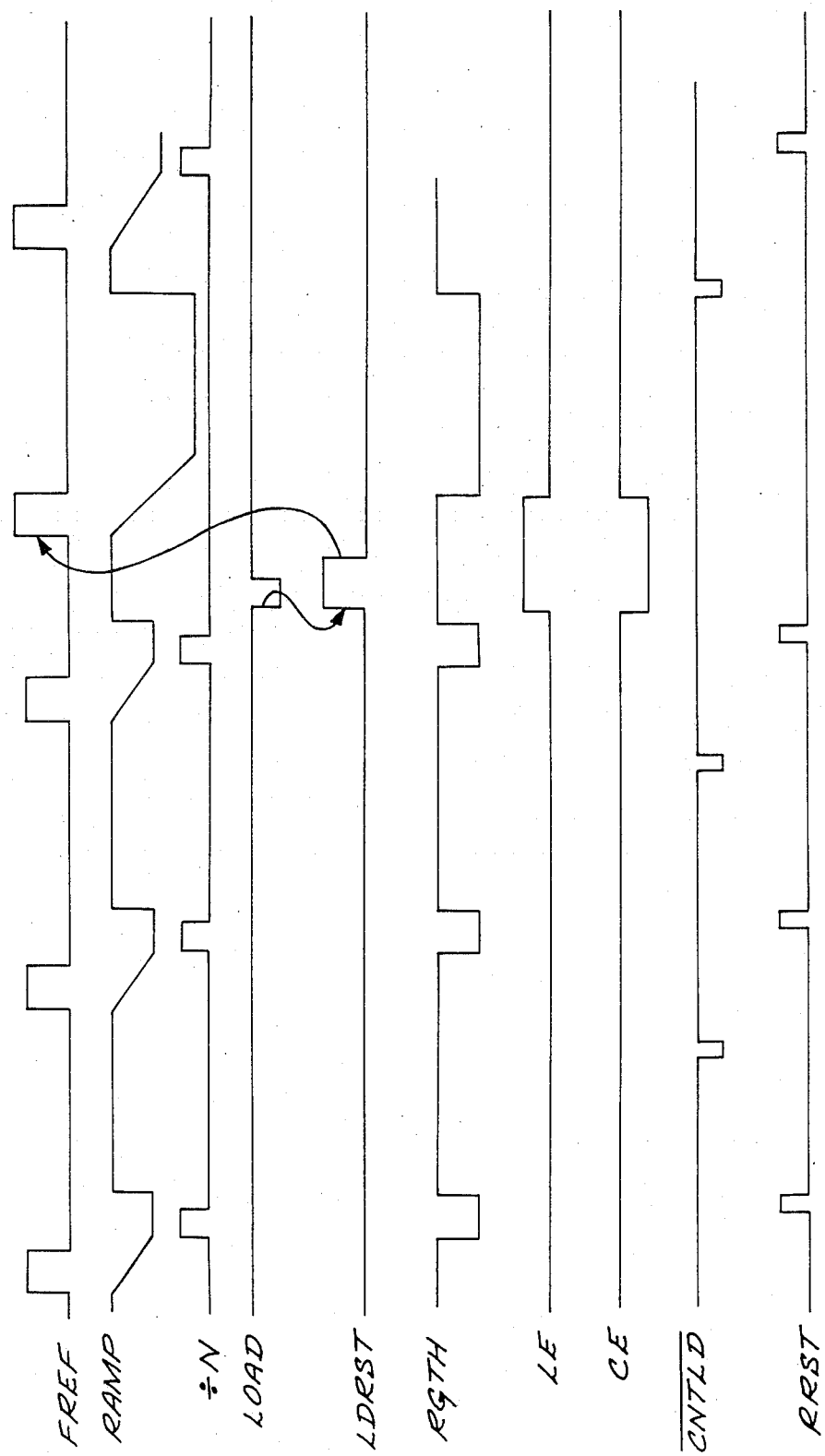
FIG. 3 is a timing diagram of certain signals in the frequency synthesizer of FIGS. 1 through 4.

In the following detailed description and in the several figures of the drawing, like elements are identified with like reference numerals.

Referring now to FIG. 1, shown therein is a block diagram of the disclosed frequency synthesizer 10 which includes a reference frequency generator 20, a sample-and-hold (S/H) phase detector 30, and a voltage controlled oscillator (VCO) 40. The reference frequency generator 20 provides a reference frequency FREF to the S/H phase detector 30, and further provides a negated count load signal $\overline{\text{CNTLD}}$ for resetting a ramp generator (described more fully below) in the S/H phase detector 30. The S/H phase detector 30 provides a fine-tune signal FT to the voltage controlled oscillator 40. The VCO 40 provides the frequency synthesizer output FOUT which has a frequency that is a function of the voltage of the fine-tune signal FT. As is well known, a voltage controlled oscillator can be coarse tuned to a particular frequency and then can be fine tuned with a fine tune signal. As shown, the VCO 40 accepts a coarse tune signal CT from a control circuit described further below.

The frequency synthesizer 10 further includes a frequency translator 50 which accepts the signal FOUT as an input and provides an output signal FTRANS which has a frequency that is the difference between a fixed frequency an the frequency of the output signal FOUT. By way of example, FOUT can have a frequency from 1275 MHz to 1530 MHz, and the frequency translator 50 reduces a fixed frequency of 1800 MHz by the frequency of FOUT. The signal FTRANS would have a frequency from 270 MHz to 525 MHz. The primary purpose of the frequency translator 50 is to provide frequencies within the operating range of available pulse dividing circuitry.

The FTRANS signal is provided to a divide-by-N circuit 60 which provides a divide-by-N signal ($\div$N) as a function of a frequency word input signal FW which has a value N, where N is an integer. Specifically, the divide-by-N circuit 60 provides a divide-by-N signal pulse for every $N^{th}$ pulse of the FTRANS signal. The divide-by-N circuit 60 is controlled by a load enable signal LE and a count enable signal CE which are provided by a divide-by-N control circuit 70.

When the frequency synthesizer 10 is in phase-lock, the divide-by-N signal will be in a fixed phase relation with the reference signal FREF. The relation between the frequencies of FREF and FOUT can be defined as follows for the above example where the frequency translater 50 is a fixed frequency of 1800 MHz:

$$f(\text{FTRANS}) = 1800 - f(\text{FOUT}) \quad \text{(Eq. 1)}$$

$$f(\text{FTRANS}) = Nf(\text{FREF}) \quad \text{(Eq. 2)}$$

$$1800 - f(\text{FOUT}) = Nf(\text{FREF}) \quad \text{(Eq. 3)}$$

$$f(\text{FOUT}) = 1800 - Nf(\text{FREF}) \quad \text{(Eq. 4)}$$

Thus, the frequency of FOUT is determined by the value of the division ratio N and the frequency of the reference signal FREF. In the disclosed embodiment, the reference signal FREF has frequency of 3 MHz. Therefore, for the previously mentioned exemplary maximum freuqency for FOUT of 1530 MHz, the value for the division ratio N would be 90. For a minimum frequency for FOUT of 1275 MHz, the value for the division ratio N would be 175.

The divide-by-N control circuit 70 is responsive to externally provided signals for controlling the frequency of the synthesizer output FOUT. Specifically the divide-by-N control circuit 70 is responsive to a LOAD signal, a preset data signal PRST, and a word clock signal WCLK. The LOAD signal indicates that a new frequency will be programmed into the frequency synthesizer 10, the preset data signal PRST is indicative of the new frequency, and the clock signal WCLK causes the preset data signal PRST to be read in. In response to the LOAD signal a load reset signal LDRST is provided to S/H phase detector 30 and a negated load reset signal $\overline{\text{LDRST}}$ is provided to the reference generator 20, indicating to the those circuits that a new frequency is being programmed. The presence of the LOAD signal further causes the count enable signal CE to go high to prevent the divide-by-N circuit 60 from providing any divide-by-N signal pulses for a predetermined period. In response to the preset data signal PRST, the divide-by-N control circuit 70 provides to the VCO 40 a coarse tune signal CT indicative of the new frequency.

Pursuant to the LOAD signal, the load enable signal LE is provided to the divide-by-N circuit 60 which reads in a frequency word signal FW which has the new value of N that is indicative of the new frequency. When the load enable signal LE goes low, the count enable signal CE goes high to allow the divide-by-N circuit 60 to provide divide-by-N pulses to the S/N phase detector 30.

The divide-by-N control circuit 70 further provides to the S/H phase detector 30 a gain control voltage (GCV) signal which has a level indicative of the frequency data provided by the preset data signal PRST. The gain control signal GCV is utilized by the S/H phase detector 30 to provide gain compensation as a function of the division ratio N (discussed below).

Referring now to FIG. 2, shown therein is a block diagram schematic of the major components of the S/H phase detector 30 which includes a ramp control circuit 80 for controlling a ramp generator 90. The ramp control circuit 80 is responsive to the reference frequency signal FREF, the load reset signal LDRST, the negated count load signal $\overline{\text{CNTLD}}$ and the divide-by-N signal. As will be discussed more fully with reference to the timing diagram of FIG. 3, the RAMP signal is started by the leading edge of the FREF signal and is stopped by the leading edge of a divide-by-N signal pulse. The RAMP signal is reset to its initial fixed value by one of several signals and remains at that value until the next occurrence of an FREF pulse. The ramp control circuit 80 further produces a sample control signal SC which comprises a series of pulses which correspond to the divide-by-N signal pulses. Particularly, a sample control signal SC pulse occurs pursuant to each occurrence of a divide-by-N signal pulse.

The RAMP signal from the ramp generator and buffer 90 is provided to a sample-and-hold (S/H) circuit 100 which also accepts as an input the sample control signal SC from the ramp control circuit 80. As will be discussed more fully below, the S/H circuit 100 samples the value of the RAMP signal pursuant to the occurrence of a sample control signal SC pulse.

The S/H pulse detector 30 further includes a ramp current compensation circuit 110 which is responsive to the gain control signal GCV. By way of example, the ramp generator and buffer 90 may include a constant current source for appropriately charging a ramp capacitor. The ramp current compensation circuit 110 could then be a voltage controlled current source which modifies the current provided to the ramp generator buffer 90. Thus, the slope of the RAMP signal is controlled by the ramp compensation circuit 110 as a function of the gain control signal GCV. The voltage of the gain control signal GCV is controlled by the value of the preset data signal PREST which is indicative of the desired frequency of FOUT and, therefore, is indicative of the value of the division ratio N. For the negative going RAMP signal as shown in FIG. 3, it is contemplated that as the division ratio N increases the ramp becomes steeper. This follows from the known fact that in order to achieve fast lock ideally the phase detector gain ($K_p$) and the VCO gain ($K_v$) should be related as follows:

$$C = (K_p K_v)/N \quad \text{(Eq. 5)}$$

In the foregoing equation, C is a constant and the VCO gain $K_v$ will generally be constant. Therefore, the ratio $K_p/N$ should be held to a constant. Since the gain $K_p$ of the S/H phase detector 30 is proportional to the slope of the RAMP signal, changing the ramp current as a function of the division ratio N will allow for a substantially constant value for the ratio $K_p/N$. Thus, whenever a new frequency is chosen by an appropriately chosen value for the division ratio N, the divide-by-N control circuit 70 provides a gain control signal GCV having a voltage level that is a function of the newly chosen division ratio N. By doing so, the ideal conditions of Equation 5 are approached and fast lock can be achieved.

The above-described reference generator 20 is advantageously utilized to reduce the wasted time in reinitializing the S/H phase detector 30 in response to a frequency change. The command to change frequency is provided by a LOAD signal pulse. The functions and timing of the divide-by-N control circuit 70 and the reference generator 20 pursuant to a command to change frequency can be better understood with reference to the timing diagram of FIG. 3, which will be initially discussed relative to a few sample-and-hold cycles before the occurrence of a LOAD signal pulse.

Referring particularly to FIG. 3, a positive going edge of the reference frequency signal FREF starts the RAMP signal. The RAMP signal is stopped by a positive going edge of the divide-by-N signal (÷N). The RAMP signal is reset to its initial fixed value by a ramp reset signal RRST which is internal to the ramp control circuit 80 and is adapted to provided a positive pulse following a predetermined delay after occurrence of a divide-by-N pulse. Such predetermined delay must be sufficient to allow the S/H circuit 100 to sample the level of the RAMP signal.

The "ramp goes through half" signal RGTH goes low when the RAMP is about one-half of its maximum negative voltage, and stays low until the RAMP signal is reset to its initial value.

In the event of the RAMP signal has not been reset to its initial value when the $\overline{\text{CNTLD}}$ signal goes low, the $\overline{\text{CNTLD}}$ signal causes the RAMP signal to be reset.

Upon the occurrence of a negative going LOAD pulse, the load reset signal LDRST goes high which causes the ramp control circuit 80 to reset the RAMP to its initial value. The negated load reset signal $\overline{\text{LDRST}}$ goes low pursuant to the LOAD pulse. The negated load reset signal $\overline{\text{LDRST}}$ also causes the load enable signal LE to go high and the count enable signal CE to go low. This disables the divide-by-N circuit (FIG. 1), thereby preventing any divide-by-N pulses and enables the divide-by-N circuit to read in the frequency word FW. When FREF goes high, it causes the RAMP siganl to ramp (FIG. 3). The "ram goes through half" signal RGTH eventually goes low, thereby causing the load enable signal to go low and the count enable signal to go high. The divide-by-N circuit will then start counting to provide a divide-by-N pulse for every Nth pulse of the translated signal FTRANS.

In the disclosed example where N would be 90 or greater, a long interval would pass if the RAMP signal had to be reset by the divide-by-N signal after a new frequency is commanded by the LOAD signal. Such a long interval is avoided by utilizing the negated count load signal $\overline{\text{CNTLD}}$ to reset the RAMP signal if it is not already reset to its initial state. After the LOAD operation and the subsequent reset of the RAMP signal by the negated cound load signal $\overline{\text{CNTLD}}$, subsequent $\overline{\text{CNTLD}}$ pulses will occur at times when the RAMP signal will have been reset to its initial level by the divide-by-N signal.

The foregoing described divide-by-N control circuit 70 and reference frequency generator 20 cooperate to achieve very fast reinitialization of the S/H phase detector 30 after a LOAD operation. This is accomplished by restarting the reference frequency FREF so that an FREF pulse occurs after only two cycles of the 30 MHz reference clock RCLK and by resetting the RAMP signal with the negated count load signal $\overline{\text{CNTLD}}$ instead of waiting for a divide-by-N pulse.

Figure 4:
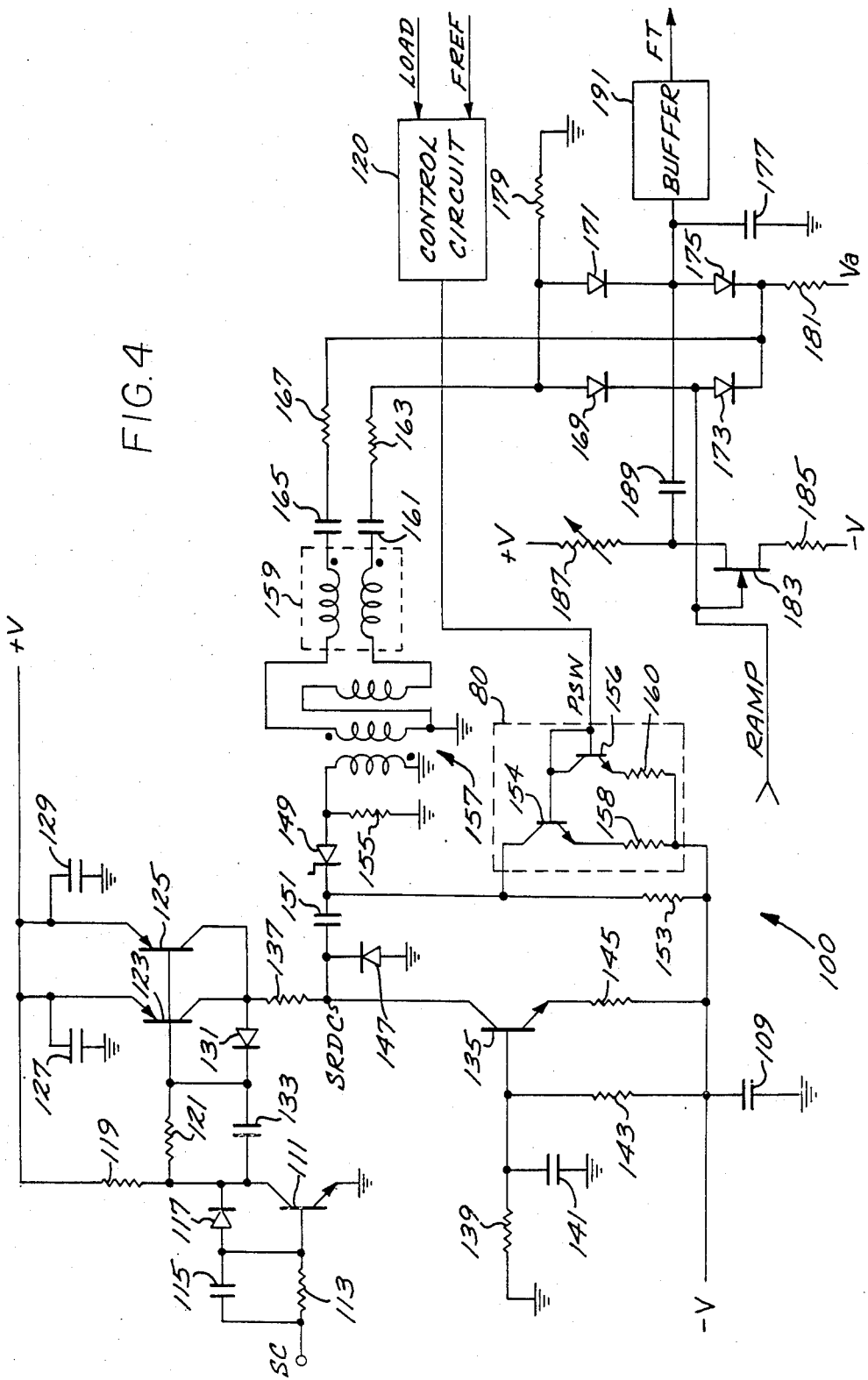
FIG. 4 is a circuit schematic diagram of part of the sample-and-hold circuit of the phase detector of FIG. 2.

Referring now to FIG. 4, shown therein is a circuit schematic of the sample-and-hold circuit 100 of the invention which includes an input transistor 111 that is biased in a common-emitter configuration. The sample control signal SC is provided to the base of the transistor 111 via an input resistor 113 and a speed-up capacitor 115 which is in parallel with the resistor 113. A Schottky diode 117 is coupled across the base and collector terminals of the transistor 111 to prevent the transistor 111 from saturating. The collector of the transistor 111 is further connected to the source of positive supply voltage +V through a biasing resistor 119 and also provides inputs via a resistor 121 to the base terminals of parallel transistors 123 and 125.

The emitters of the parallel transistors 123 and 125 are connected to the source of positive supply voltage +V. Capacitors 127 and 129 are coupled between ground and the emitters of the parallel transistors 123 and 125, and function to prevent signal spikes from entering the power supply circuitry. A Schottky diode 131 has its anode connected to the collectors of the transistors 123 and 125, and has its cathode connected to the base terminals of the parallel transistors 123 and 125. The Schottky diode 131 functions as a clamp to prevent the transistors 123 and 125 from saturating. A speed-up capacitor 133 is connected between the cathode of the diode 131 and a collector of the transistor 111.

A transistor 135 is configured as a constant current sink for the transistors 123 and 125 which have their collector terminals connected to the collector terminal of the transistor 135 via a resistor 137. A resistor 139 and a capacitor 141 are connected in parallel between ground and the base of the transistor 135. The base of the transistor 135 is further coupled to a source of negative supply voltage −V via a resistor 143.

The emitter of the transistor 135 is coupled to the source of negative supply voltage −V via a resistor 145. A capacitor 109 is coupled between the source of negative supply voltage −V and ground to prevent signal spikes from entering the power supply circuitry. The collector of the transistor 135 is further connected to the cathode of a diode 147 which has its anode connected to ground.

When the transistors 123 and 125 are conducting, they comprise a low impedance current source and their collectors provide current to the collector of the transistor 135. The diode 147 is non-conducting when the transistors 123 and 125 are conducting, and is conducting when the transistors 123 and 125 are non-conducting.

The cathode of a step recovery diode (SRD) 149 is coupled via a DC blocking capacitor 151 to the collector of the transistor 135, and is also coupled via a resistor 153 to the source of negative supply voltage −V.

A bipolar current source 80, including transistors 154 and 156 and resisors 158 and 160, is further coupled between the cathode of the SRD 149 and the source of negative supply voltage −V. Specifically, the collector of the transistor 154 is connected to the cathode of the SRD 149, and the emitter of the transistor 154 is coupled via a resistor 158 to the source of negative supply voltage −V. The emitter of the transistor 156 is coupled via the resistor 160 to the source of negative supply voltage −V. The base of the transistor 154, and the collector and base of the transistor 156 are connected together to receive a pulse width control signal PSW from a pulse width control circuit 120. As discussed more fully below, the pulse width control circuit 120 is responsive to the LOAD signal and the reference signal FREF, discussed previously, and selectively causes the control signal PSW to be high or low as a function of the occurrence of a LOAD signal pulse.

The anode of the SRD 149 is coupled to ground via a resistor 155 which is in parallel with the input to a trifilar transformer 157. The outputs of the trifilar transformer 157 are connected to a bifilar balun 159 which provides balanced currents. One output of the bifilar balun 159 is connected to a capacitor 161 which is in series with a resistor 163. The other output of the bifilar balun 159 is connected to a capacitor 165 which is in series with a resistor 167.

When the transistors 123 and 125 are non-conducting, the SRD 149 is forward biased. The forward bias current for the SRD 149 is controlled by the resistor 153 and the conductive state of the current source 80. If the current source 80 is on, then the forward bias current is greater than when the current source is off. As discussed more fully herein, the turn-off time of the SRD 149 controls the width of a sampling pulse, and such turn-off time is controlled by selectively controlling the current source 80 to be on or off.

When the transistors 123 and 125 are conducting, the SRD 149 is reverse biased. The reverse bias current for the SRD 149 is provided by the transistors 123 and 125.

The outputs of the bifilar balun 159 are coupled to a diode sampling bridge which includes the diodes 169, 171, 173 and 175. Specifically, the resistor 163 is connected to the anodes of the diodes 169 and 171. The resistor 167 is connectd to the cathodes of the diodes 173 and 175. The cathode of the diode 169 is connected to the anode of the diode 173, and the cathode of the diode 171 is connected to the anode of the diode 175.

The RAMP signal provides an input to the diode bridge and is connected to the node between the diode 169 and the diode 173. The output of the sampling bridge is at the node between the diode 171 and the diode 175, and a hold capacitor 177 is connected between such node and ground. The voltage on the hold capacitor 177 is provided to a buffer 191 which produces the fine tune signal FT for the VCO 40 (FIG. 1).

In order to reduce perturbations of the hold capacitor 177, the diodes 169, 171, 173 and 175 should be very closely matched as to forward voltage drop and as to reverse bias capacitance since glitches would be caused by mismatch. By way of example, forward drop matching should be within about 10 millivolts and reverse bias capacitance should be within a few tenths of a picofarad.

The overall operation of the sample-and-hold circuit 100 thus far described is best understood with reference to the timing diagram of FIG. 5. Specifically, the presence of a sample control signal SC pulse renders the transistors 123 and 125 conductive, which causes a control pulse SRDC to be formed at the collector of the transistor 135 (FIG. 4). In the absence of the control pulse SRDC, the SRD 149 is normally forward biased and on. The leading edge of the control pulse SRDC causes the voltage at the cathode of the SRD 149 to go high, thereby reverse biasing the SRD 149 which tends to turn off.

As a result of the control pulse SRDC and the turn-off of the SRD 149, the diode bridge (diodes 169, 171, 173 and 175) receives a sample signal having a leading edge determined by the leading edge of the control pulse SRDC and having a trailing edge determined by the turn-off of the SRD 149. Specifically, a positive going SAMPLE pulse is provided to the anodes of the diodes of 169 and 171, and a negative going $\overline{SAMPLE}$ pulse is simultaneously provided to the cathodes of the diodes 173 and 175. When the SRD control pulse SRDC goes low, the SRD 149 becomes forward biased and turns on again.

The width of the sample signal (SAMPLE and $\overline{SAMPLE}$) is particularly defined by the delay between the leading edge of the control pulse SRDC and the turn-off of the SRD 149. Such delay results from the time interval necessary to deplete carriers in the SRD 149, which is determined by the level of the forward bias current being conducted by the SRD 149. Specifically, with more forward bias current being conducted by the SRD, the SRD takes longer to turn off. As discussed previously, the forward bias current for the SRD 149 is controlled by the resistor 153 and the conductive state of the current source 80.

For a wider sample signal, the pulse width control signal PSW is set high, which renders the current source 80 conductive. For a narrower sample signal, the pulse width control signal PSW is set low, which renders the current source non-conductive.

In operation, the width of the sample signal (SAMPLE and $\overline{\text{SAMPLE}}$) is controlled to be wider during acquisition than during steady-state operation. For example, the sample signal pulse width for acquisition may be 50 nanoseconds, and the sample signal pulse width for steady-state operation may be 5 nanoseconds.

By way of example, the pulse width control circuit 120 may include appropriate logic and counter circuitry for setting the control signal PSW high in response to the occurrence of a LOAD signal pulse. The control signal PSW is maintained high for a predetermined number of pulses of the reference signal FREF. Such predetermined number of pulses is based on a time interval considered sufficient for phase-lock acquisition to have been achieved. The pulse width control signal PSW is then set low, and the current source 80 turns off. The loop bandwidth very rapidly decreases within one sample period as defined by the occurrence of the divide-by-N signal pulses.

Referring again to the diode bridge, a resistor 179 is connected between the interconnected anodes of the diodes 169, 171, and ground. A resistor 181 having the same value as the resistor 179 is connected between the interconnected cathodes of the diodes 173 and 175, and a source of variable voltage $V_a$. The voltage level for $V_a$ is chosen so it is about two times the nominal voltage on the hold capacitor 177 when the frequency synthesizer is phase-locked.

An FET amplifier 183 receives the RAMP signal as an input on its gate terminal. The source of the FET 183 is coupled to the source of negative supply voltage $-V$ via a resistor 185. The drain of the FET 183 is coupled to the source of positive supply voltage $+V$ via a variable resistor 187. A capacitor 189 is connected between the drain of the FET 183 and the node formed by the cathode of the diode 171, the anode of the diode 175, and one terminal of the hold capacitor 177.

The FET 183 functions as a 180 degree phase inverter which cooperates with the capacitor 189 to cancel or neutralize the leakage of the RAMP signal ("RAMP blow-through") across the diode bridge comprising the diodes 169, 171, 173, and 175 when the diodes are non-conducting. The current provided by the FET 183 to the hold capacitor 177 is controlled by setting the variable resistor 187 so that the effects of the RAMP signal leakage through the non-conducting diodes are cancelled.

With the foregoing described sample-and-hold circuit, a wider sample signal is provided for acquisition in order to achieve very high sampling efficiency which results in increased loop bandwidth. The increased sampling efficiency and loop bandwidth allow for faster acquisition. A narrower sample signal is provided for steady-state operation, which will substantially decrease the sampling efficiency and loop bandwidth. The result is steady-state operation with reduced output phase noise and lower spurious signals.

The foregoing described phase-locked frequency synthesizer provides an adaptive loop bandwidth which achieves fast phase-lock acquisition, low sampling spurs, and low phase noise without perturbing steady-state operation while changing bandwidth. Another feature of the foregoing synthesizer is the sample-and-hold circuit which provides variable efficiency that varies the loop bandwidth of the synthesizer without perturbing the steady-state operation of the synthesizer.

Although the foregoing has been a description and illustration of specific embodiments of the invention, various modifications and changes thereto can be made by persons skilled in the art without departing from the scope of the invention as defined by the following claims.

What is claimed is:

1. A sample-and-hold circuit responsive to a sample control signal for sampling an input signal provided by a signal generator, which has a characteristic resistance, during a sample interval of controllable duration, comprising:
   a hold capacitor having a capacitance value selected in regard to the value of said signal generator characteristic resistance such that the RC time constant resulting therefrom is less than the duration of the selected sample interval;
   sample pulse means for defining the sample interval by providing a sample pulse controllably having a first duration or a second duration which is greater than said first duration, comprising:
      a step recovery diode having a depletion time dependent upon its level of bias;
      bias means for providing bias current to said step recovery diode and for controlling the level of said bias current to control the duration of said sample pulse and to effect switching of said step recovery diode between on and off states in response to said sample control signal; and
      pulse means responsive to the switching of said step recovery diode for generating said sample pulse of variable duration;
   switching means responsive to said sample pulse of variable duration for providing a low impedance coupling of said input signal to said hold capacitor during the presence of said sample pulse, and for providing a high impedance coupling of the input signal to said hold capacitor in the absence of said sample pulse.

2. The sample-and-hold circuit of claim 1 wherein said pulse means includes a transformer.

3. A sample-and-hold circuit responsive to a sample control signal for sampling an input signal provided by a signal generator, which has a characteristic resistance, during a sample interval of controllable duration, comprising:
   a hold capacitor having a capacitance value selected in regard to the value of said signal generator characteristic resistance such that the RC time constant resulting therefrom is less than the duration of the selected sample interval;
   sample pulse means for defining the sample interval by providing a sample pulse controllably having a first duration or a second duration which is greater than said first duration;
   switching means responsive to said sample pulse of variable duration for providing a low impedance coupling of said input signal to said hold capacitor during the presence of said sample pulse, and for providing a high impedance coupling of the input signal to said hold capacitor in the absence of said sample pulse; and neutralizing means coupled to said hold capacitor and responsive to said input signal for neutralizing leakage current perturbations on said hold capacitor.

4. The sample-and-hold circuit of claim 3 wherein said neutralizing means provides a neutralizing signal to said hold capacitor to cancel the effect of said input signal when said switching means is providing said high impedance coupling.

5. The sample-and-hold circuit of claim 4 wherein said neutralizing means includes a phase inverter responsive to said input signal.

6. The sample-and-hold circuit of claim 5 wherein said phase inverter comprises an FET amplifier.

7. A sample-and-hold circuit for sampling an input signal comprising:
- sample pulse means responsive to a sample control signal for providing a sampling pulse;
- pulse width control means for selectively controlling the width of said sampling pulse, comprising:
  - a diode having a stored charge depletion time dependent upon bias level; and
  - bias means for providing bias current to said diode and for controlling the level of said bias current to control the width of said sample pulse;
- wherein said sample pulse means comprises pulse means for selectively depleting the stored charge of said diode in response to the sample control signal;
- switching means responsive to the input signal and said sampling pulse for providing a sampled signal as a function of the input voltage during the presence of said sampling pulse; and
- storage means for storing said sampled signal.

8. The sample-and-hold circuit of claim 7 wherein said bias means comprises a controlled current source for selectively varying the forward bias current through said diode.

* * * * *